United States Patent
Andersen et al.

(10) Patent No.: US 10,620,340 B2
(45) Date of Patent: Apr. 14, 2020

(54) TUNING DIGITAL CORE ANALYSIS TO LABORATORY RESULTS

(71) Applicant: Schlumberger Technology Corporation, Sugar Land, TX (US)

(72) Inventors: Mark Andersen, Houston, TX (US); Denis Klemin, Houston, TX (US); Alexander Nikolaevich Nadeev, Spring, TX (US)

(73) Assignee: SCHLUMBERGER TECHNOLOGY CORPORATION, Sugar Land, TX (US)

(*) Notice: Subject to any disclaimer, the term of this patent is extended or adjusted under 35 U.S.C. 154(b) by 451 days.

(21) Appl. No.: 15/102,225

(22) PCT Filed: Oct. 2, 2014

(86) PCT No.: PCT/US2014/058716
§ 371 (c)(1),
(2) Date: Jun. 6, 2016

(87) PCT Pub. No.: WO2015/084481
PCT Pub. Date: Jun. 11, 2015

(65) Prior Publication Data
US 2016/0306074 A1    Oct. 20, 2016

Related U.S. Application Data

(60) Provisional application No. 61/911,957, filed on Dec. 4, 2013.

(51) Int. Cl.
*G01V 99/00* (2009.01)
*E21B 43/00* (2006.01)
(Continued)

(52) U.S. Cl.
CPC ............ *G01V 99/005* (2013.01); *E21B 43/00* (2013.01); *E21B 49/02* (2013.01); *G01V 99/00* (2013.01);
(Continued)

(58) Field of Classification Search
CPC .. G01V 99/005; G01V 99/00; G06F 17/5009; E21B 49/02; E21B 43/00; E21B 49/00; E21B 25/00
See application file for complete search history.

(56) References Cited

U.S. PATENT DOCUMENTS 7,277,795 B2    10/2007    Boitnott
7,333,892 B2    2/2008    Egermann et al.
(Continued)

FOREIGN PATENT DOCUMENTS

WO    WO2013106720 A1    7/2013
WO    WO2013169137 A1    11/2013

OTHER PUBLICATIONS

American Petroleum Institute, "Recommended Practices for Core Analysis, Recommended Practice 40," 2ed, Feb. 1998 (Year: 1998).*
(Continued)

*Primary Examiner* — Rehana Perveen
*Assistant Examiner* — Steven W Crabb
(74) *Attorney, Agent, or Firm* — Cameron R. Sneddon

(57) ABSTRACT

A method and computer system for performing simulation of a field having a subterranean formation. The method includes obtaining measured core sample data of a core sample retrieved from the formation, the core sample data measured by injecting fluid into the core sample, obtaining a digital rock model of the core sample describing a physical pore structure in the core sample, and obtaining a fluid model describing a physical property of the fluid. A digital core analysis (DCA) of the core sample is performed to
(Continued)

generate a DCA simulation result and the DCA is tuned using the measured core sample data to reduce a difference between the DCA simulation result and the measured core sample data. The tuning is performed by adjusting, in response to the difference exceeding a pre-determined limit, a parameter of the DCA to generate an adjusted parameter and further performing the DCA to reduce the difference.

10 Claims, 5 Drawing Sheets

(51) Int. Cl.
    *E21B 49/02*     (2006.01)
    *G06F 17/50*     (2006.01)
    *E21B 25/00*     (2006.01)
    *E21B 49/00*     (2006.01)

(52) U.S. Cl.
    CPC .......... *G06F 17/5009* (2013.01); *E21B 25/00* (2013.01); *E21B 49/00* (2013.01)

(56) References Cited

U.S. PATENT DOCUMENTS

| | | | |
|---|---|---|---|
| 8,868,392 B2* | 10/2014 | Beattie | E21B 43/16 703/10 |
| 2007/0016389 A1 | 1/2007 | Ozgen | |
| 2009/0182540 A1 | 7/2009 | Cox et al. | |
| 2009/0259446 A1 | 10/2009 | Zhang et al. | |
| 2010/0198638 A1 | 8/2010 | Deffenbaugh et al. | |
| 2011/0015907 A1 | 1/2011 | Crawford et al. | |
| 2011/0060572 A1 | 3/2011 | Brown et al. | |
| 2012/0221306 A1 | 8/2012 | Hurley et al. | |
| 2012/0232859 A1 | 9/2012 | Pomerantz et al. | |
| 2012/0253770 A1 | 10/2012 | Stern et al. | |
| 2013/0259190 A1 | 10/2013 | Walls et al. | |
| 2014/0044315 A1 | 2/2014 | Derzhi et al. | |

OTHER PUBLICATIONS

Knackstedt, M.A., et al., "Digital Core Laboratory: Properties of reservoir core derived from 3D images" SPE 87009, pp. 1-13, 2004 (Year: 2004).*

Kalam, M.Z., "A Case Study to Demonstrate the Use of Scal Data in Field Development Planning of a Middle East Carbonate Reservoir," Society of Core Analysts, SCA2006-18 pp. 1-11, (2006). (Year: 2006).*

Examination Report issued in the related AU application 2014357650, dated Oct. 16, 2017 (2 pages).

Demianov et al., "Density Functional Modelling in Multiphase Compositional Hydrodynamics", 89 Can. J. Chem. Eng., 206, 211-12 (Apr. 2011).

Koroteev, et al,. "Application of Digital Rock Technology for Chemical EOR Screening", SPE-165258, Kuala Lumpur, Malaysia, Jul. 2-4, 2013 (12 pages).

International Search Report and Written Opinion issued in the related PCT Application PCT/US2014/058716, dated Jan. 23, 2015 (10 Pages).

International Preliminary Report on patentabiltiy issued in the related PCT Application PCT/US2014/058716, dated Jun. 7, 2016 (6 Pages).

Extended Search Report issued in the related EP Application 14868100.0, dated May 23, 2017 (7 pages).

Arns C.H. et al., Digital Core Laboratory: Petrophysical Analysis from 3D Imaging of Reservoir Core Fragments, Petrophysics, Society of Professional Well Log Analysts, Houston TX, US, vol. 46, No. 4, Aug. 1, 2005, pp. 260-277.

* cited by examiner

TUNING DIGITAL CORE ANALYSIS TO LABORATORY RESULTS

CROSS-REFERENCE TO RELATED APPLICATION

This application claims priority from U.S. Provisional Application 61/911,957, filed Dec. 4, 2013, which is incorporated herein by reference in its entirety.

BACKGROUND

Operations, such as geophysical surveying, drilling, logging, well completion, and production, are typically performed to locate and gather valuable downhole fluids. Surveys are often performed using acquisition methodologies, such as seismic mapping and resistivity mapping, to generate images of underground formations. These formations are often analyzed to determine the presence of subterranean assets, such as valuable fluids or minerals, or to determine if the formations have characteristics suitable for storing fluids. Although the subterranean assets are not limited to hydrocarbons such as oil, throughout this document, the terms "oilfield" and "oilfield operation" may be used interchangeably with the terms "field" and "field operation" to refer to a site where any types of valuable fluids or minerals can be found and the activities to extract them. The terms may also refer to sites where substances are deposited or stored by injecting them into the subsurface using boreholes and the operations associated with this process. Further, the term "field operation" refers to a field operation associated with a field, including activities related to field planning, wellbore drilling, wellbore completion, and/or production using the wellbore.

Simulations are commonly used in the oil industry and other industries to model processes and predict behaviors. Each type of simulation is relevant to a certain scale of process. A common example in the oil industry is the use of reservoir flow models to predict dynamic behavior at the scale of a reservoir, which can be from a few meters to hundreds of meters thick and can be thousands of meters in lateral extent. The volume elements in these models are typically on the order of meters or tens of meters on a side. Reservoir scale processes, such as developed miscibility, can develop within the model.

At the other extreme, micromodels of porous media represent small pieces of the media, typically with volume elements on the order of a few microns for micro-computed tomography (micro-CT) or less (e.g., 100 times smaller for scanning electron microscopy (SEM) imaging) on a side and full models that are on the order of millimeters or less in extent. In these models, the small size means the residence time of fluids within the model is too short for many processes to develop fully. The present disclosure is within the domain of these small models.

Static micromodels representing pore and grain geometry can be obtained in several ways at different scales. Thin sections of rocks are formed by injecting a colored epoxy into a rock and then slicing an optically thin section and mounting it onto a glass slide. This is optically analyzed to obtain images of the pores and grains. Multiple thin sections can be used to create a micromodel, typically using statistical distributions rather than making an image directly from stacked thin sections. Alternatively, a small rock volume can be scanned using X-rays in a micro-CT machine. The tomographic inversion of the X-ray scans is used to create a static model of a rock with resolution ranging from tens of microns to tens of nanometers. This computed tomography (CT) image is processed and segmented into grains and pores. A third method uses ion beam milling and scanning electron microscopy to create a series of images with nanometer-scale resolution. These images can be analyzed and used to construct a static three-dimensional (3D) model of a tiny portion of the rock.

Micromodels for flow-dynamic behavior in porous media are of a few types. Pore network models substitute a complex network of nodes and connectors to represent the pores and pore throats, respectively. The network is based on a static representation rock model, and flow dynamics are applied to the pore network. Lattice Boltzmann models are based on the movement of particles on 3D grid, which can be placed within a static rock model. A third method uses microhydrodynamical modeling in a static rock model to represent simple or complex fluid-fluid and fluid-rock interactions during flow or while a chemical process develops.

All of these micromodels represent small portions of a real rock. Processes that require time, distance, or extensive gradients, for example of pressure or concentration, are not captured in such a simulation.

History matching is a procedure for reservoir modeling. Inputs to the model include seismic data, well logs, core description and core data, production rates and pressures, and well tests, as examples. From these data, a model of the reservoir and its flow characteristics is developed. A flow simulation results in predictions of well production rates and pressures at wells, among other data. Discrepancies between the predicted and measured well data indicate places that the reservoir model may be adjusted, after which the model is rerun and evaluated again in comparison with the measured data.

BRIEF SUMMARY OF THE DISCLOSURE

The present disclosure describes a method and computer system for performing simulation of a field having a subterranean formation. The method includes obtaining measured core sample data of a core sample retrieved from the formation, the measured core sample data measured by injecting fluid into the core sample according to a laboratory test procedure, obtaining a digital rock model of the core sample and a fluid model of the fluid, the digital rock model describing a physical pore structure in the core sample and the fluid model describing a physical property of the fluid. A digital core analysis (DCA) of the core sample is then performed by the computer system to generate a DCA simulation result. The DCA includes simulating, based on the digital rock model, the fluid model, and one or more parameters defined by the laboratory test procedure, injecting the fluid into the core sample to generate the DCA simulation result which models applying the laboratory test procedure to the core sample. The DCA is then tuned using the measured core sample data to reduce a difference between the DCA simulation result and the measured core sample data. The tuning includes adjusting, in response to the difference exceeding a pre-determined limit, a parameter of the DCA to generate an adjusted parameter, and further performing the DCA based on the adjusted parameter to reduce the difference.

Simulating injecting the fluid into the core sample may include representing portions of the core sample by multiple digital rock model instantiations, simulating, based on a first injection input and a first digital rock model instantiation, a first of the portions of the core sample to generate a first effluent output, and simulating, based on the first effluent output and a second digital rock model instantiation, a second of the portions of the core sample to generate a second effluent output, the DCA simulation result being based on the first and second effluent outputs.

The parameter of the DCA may include one or more of a digital core parameter of the digital rock model, a fluid parameter of the fluid model, and the one or more parameters defined by the laboratory test procedure, and the fluid model may include an equation of state model of the fluid.

Finally, the fluid model may include a fluid model description based on the Helmholtz free energy model constructed from one or more of phase behavior data, correlated phase behavior data, and an equation of state model, and performing the DCA may be based on a Density Functional (DF) method for complex pore-scale hydrodynamics.

BRIEF DESCRIPTION OF THE DRAWINGS

The appended drawings illustrating several embodiments of tuning digital core analysis to laboratory results are not to be considered limiting of its scope, for tuning digital core analysis to laboratory results may admit to other equally effective embodiments.

DETAILED DESCRIPTION

Figure 1:
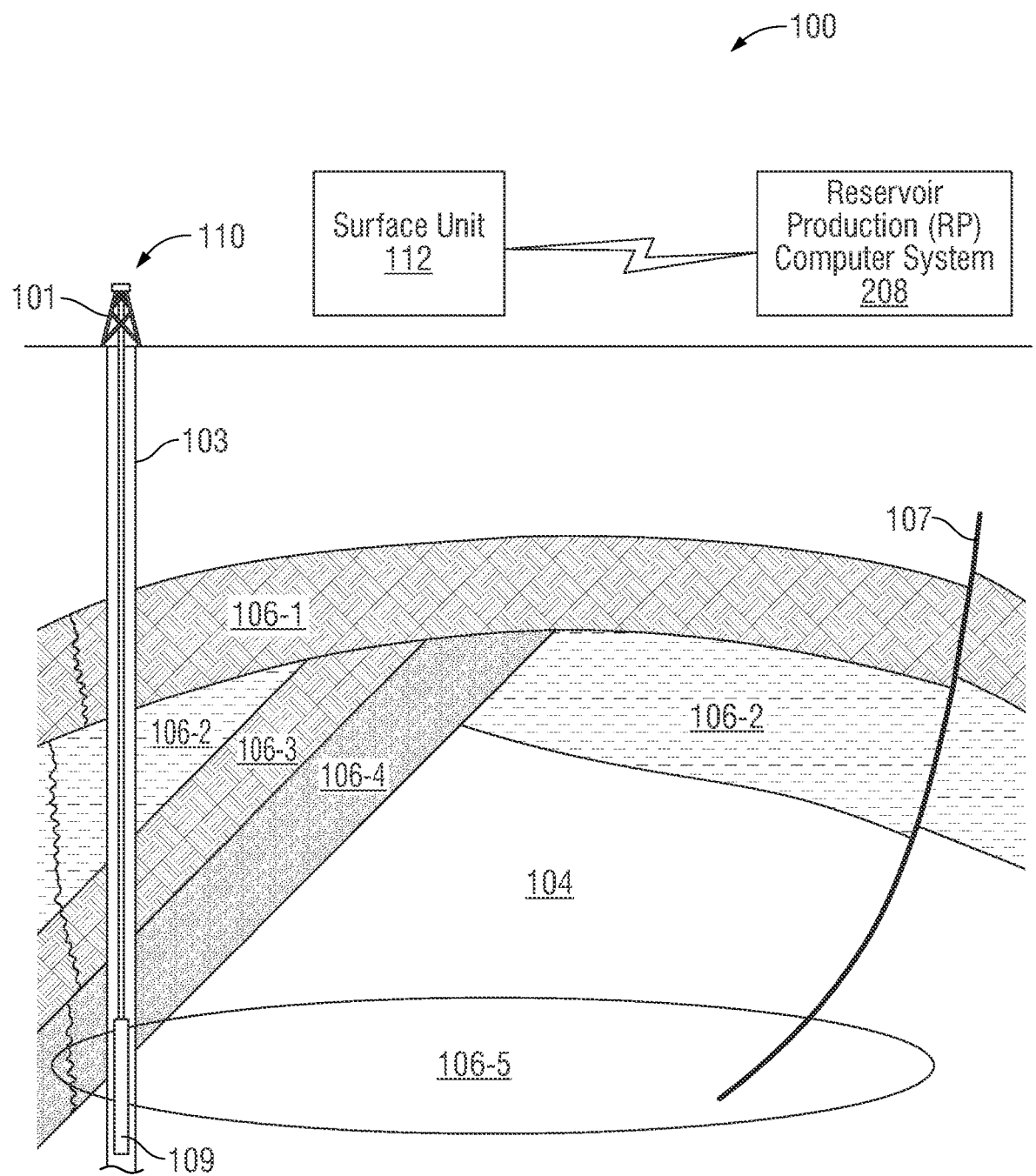
FIG. 1 is a schematic view, partially in cross-section, of a field in which one or more embodiments of tuning digital core analysis to laboratory results may be implemented.

Aspects of the present disclosure are shown in the above-identified drawings and described below. In the description, like or identical reference numerals are used to identify common or similar elements. The drawings are not necessarily to scale and certain features may be shown exaggerated in scale or in schematic in the interest of clarity and conciseness.

The term digital rock model, as used herein, refers to pore and grain level models, such as a micromodel, of a porous medium. The resolution of these models is typically in the range of a few microns or less. Fluid flow processes may be simulated in a digital rock model using various techniques. These flow processes represent subterranean fluids that are native to a rock formation or injected into the rock formation. In particular, the subterranean fluids may include liquids, gases, injectants, or combinations thereof.

The term core sample, as used herein, refers to a 3D porous medium representing a portion of the oilfield. In particular, a core sample refers to a physical sample obtained from a portion of the oilfield. For example, the core sample may be obtained by drilling into the portion of the oilfield with a core drill to extract the core sample from the portion of the oilfield. The core sample may contain subterranean fluids, such as multiphase compositional fluids.

The term digital core analysis (DCA), as used herein, refers to using the digital rock model to simulate a laboratory test that is applied to a core sample. For example, the laboratory test may include injecting fluid into the core sample according to a laboratory test procedure. Typically, the laboratory test is performed (i.e., applied to the core sample) to obtain measurements (i.e., laboratory test results or simply laboratory results) from the core sample. Such measurements are referred to as measured core sample data and correspond to physical evaluation of the core sample. In contrast, the results of DCA are referred to as DCA simulation results and correspond to digital evaluation (i.e., simulation) of the core sample.

One or more aspects of tuning digital core analysis provides a workflow that incorporates laboratory test results to tune or history-match the DCA that represents the laboratory test. The laboratory test results are used to define or refine unknown or uncertain parameters of the digital rock model used in the DCA. This refinement improves the match between the measured core sample data and the DCA simulation results. Accordingly, the digital rock model is improved to provide better understanding of the physical nature of the rocks and flow through the rocks.

FIG. 1 depicts a schematic view, partially in cross section, of a field 100 in which one or more embodiments of user sourced data issue management may be implemented. In one or more embodiments, one or more of the modules and elements shown in FIG. 1 may be omitted, repeated, and/or substituted. Accordingly, embodiments of user sourced data issue management should not be considered limited to the specific arrangements of modules shown in FIG. 1.

As shown in FIG. 1, the subterranean formation 104 includes several geological structures (106-1 through 106-4). As shown, the formation includes a sandstone layer 106-1, a limestone layer 106-2, a shale layer 106-3, and a sand layer 106-4. A fault line 107 extends through the formation. One or more of the geological structures (106-1 through 106-4) may be part of a reservoir (e.g., reservoir 106-5 of subterranean fluids. In one or more embodiments, various survey tools and/or data acquisition tools (e.g., data acquisition tool 109) are adapted to measure the formation and detect the characteristics of the geological structures of the formation and/or subterranean fluids contained in the geological structures.

Further, as shown in FIG. 1, the wellsite system 110 is associated with a rig 101, a wellbore 103, and other wellsite equipment and is configured to perform wellbore operations, such as logging, drilling, fracturing, production, or other applicable operations. Generally, survey operations and wellbore operations are referred to as field operations of the field 100. These field operations may be performed as directed by the surface unit 112.

In one or more embodiments, the surface unit 112 is operatively coupled to a reservoir production (RP) computer system 208 and/or the wellsite system 110. In particular, the surface unit 112 is configured to communicate with the RP computer system 208 and/or the wellsite system 110 to send commands to the RP computer system 208 and/or the wellsite system 110 and to receive data therefrom. For example, the wellsite system 110 may be adapted for measuring downhole properties using logging-while-drilling (LWD) tools and for obtaining core samples. In one or more embodiments, the surface unit 112 may be located at the wellsite system 110 and/or remote locations. The surface unit 112 may be provided with computer facilities for receiving, storing, processing, and/or analyzing data from the RP computer system 208, the wellsite system 110, or other part of the field 100. The surface unit 112 may be provided with scanning and other laboratory facilities for obtaining 3D porous solid images of the core samples and/or performing laboratory tests on the core samples obtained by the wellsite system 110. The surface unit 112 may then send the 3D porous solid image and laboratory test results to the RP computer system 208 for analysis. The surface unit 112 may also be provided with functionality for actuating mechanisms in the field 100. The surface unit 112 may then send command signals to the field 100 in response to data received, for example to control and/or optimize various field operations described above.

In one or more embodiments, the data received by the surface unit 112 represents characteristics of the subterranean formation 104 and may include seismic data and/or information related to porosity, saturation, permeability, natural fractures, stress magnitude and orientations, elastic properties, etc. during a drilling, fracturing, logging, or production operation of the wellbore 103 at the wellsite system 110.

In one or more embodiments, the surface unit 112 is communicatively coupled to the RP computer system 208. Generally, the RP computer system 208 is configured to analyze, model, control, optimize, or perform other management tasks of the aforementioned field operations based on the data provided from the surface unit 112. Although the surface unit 112 is shown as separate from the RP computer system 208 in FIG. 1, in other examples, the surface unit 112 and the RP computer system 208 may be combined.

While a specific subterranean formation 104 with specific geological structures is described above, it will be appreciated that the formation may contain a variety of geological structures. Fluid, rock, water, oil, gas, and other geomaterials may also be present in various portions of the formation 104. Further, one or more types of measurement may be taken at one or more locations across one or more fields or other locations for comparison and/or analysis using one or more acquisition tools.

Although many (e.g., hundreds or thousands) wells are typically present in a field, only a single well with a single well log is explicitly shown in the field 100 for clarity of illustration.

Figure 2:
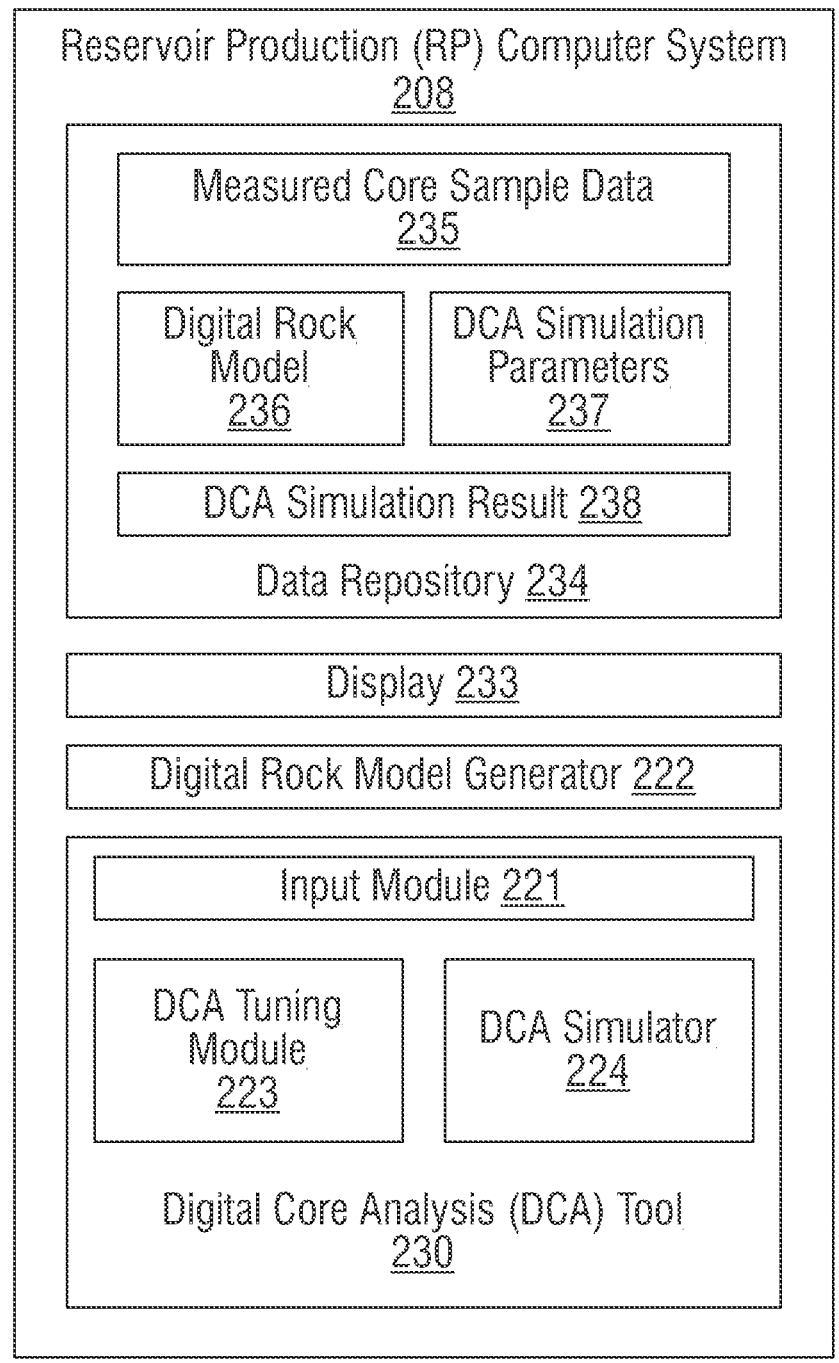
FIG. 2 shows a reservoir production computer system in accordance with one or more embodiments.

FIG. 2 shows more details of the RP computer system 208 in which one or more embodiments of tuning digital core analysis to laboratory results may be implemented. In one or more embodiments, one or more of the modules and elements shown in FIG. 2 may be omitted, repeated, and/or substituted. Accordingly, embodiments of tuning digital core analysis to laboratory results should not be considered limited to the specific arrangements of modules shown in FIG. 2.

As shown in FIG. 2, the RP computer system 208 includes the digital rock model generator 222, DCA tool 230, data repository 234, and display 233. Each of these elements is described below.

In one or more embodiments, the digital rock model generator 222 is a tool for generating a digital rock model (e.g., digital rock model 236) for the field 100. The digital rock model generator 222 may generate the digital rock model 236 based on a 3D porous solid image of a core sample. A 3D porous solid image is a 3D digital representation of the core sample that is generated using computed tomography, scanning electron microscopy, focused ion beam scanning electron microscopy, confocal microscopy, or other suitable scanning means. Specifically, the 3D porous solid image is an image of each portion of the core sample including pores and solid surfaces. Thus, the 3D porous solid image may show pores and rock boundaries of the core sample for each layer of the core sample. In accordance with one or more embodiments, the 3D porous solid image may be obtained with or without destroying the core sample in the process.

While the 3D porous solid image may show the physical structure of the core sample, the digital rock model 236 may include the lithology of the core sample. For example, the lithographic properties of the core sample may include pore size distribution, rock type, tortuosity measurements, statistical results generated from the properties, and other information. To generate the digital rock model 236, digital processing and morphological analysis of the 3D porous solid image may be performed. Specifically, consecutive application of image filtering, segmentation and multiple property recognition may be used to obtain the digital rock model 236 from the 3D porous solid image. Morphological and geometrical statistical property analysis may further be performed to obtain information, such as pore size distribution, local and average tortuosity measurement, grain size distribution, and other properties of the core sample.

In one or more embodiments, the DCA tool 230 includes software instructions stored in a memory and executing on a computer processor to communicate with the surface unit 112 for receiving data (e.g., the 3D porous solid image and laboratory test results) therefrom and to manage (e.g., analyze, model, control, optimize, or perform other management tasks) the aforementioned field operations based on the received data. In one or more embodiments, the laboratory test results are received by the input module 221 and stored in the data repository 234 as the measured core sample data 235 to be processed by the DCA tool 230. One or more field operation management tasks (e.g., analysis task, modeling task, control task, optimization task, etc.) may be performed based on the results of the DCA tool 230. In particular, the measured core sample data 235 is used to tune, continuously or intermittently, the digital rock model 236, which is in turn used to generate preliminary and final results that are stored and displayed to the user. For example, the preliminary and final results may include the DCA simulation result 238 that is selectively displayed to the user using the display 233. In one or more embodiments, the display 233 may be a 2D display, a 3D display, or other suitable display device. The processor and memory of the RP computer system 208 are not explicitly depicted in FIG. 2 so as not to obscure other elements of the RP computer system 208. An example of such processor and memory is described in reference to FIG. 5 below.

In one or more embodiments, the DCA tool 230 includes the input module 221 that is configured to obtain the measured core sample data 235 of a core sample retrieved from the subterranean formation 104. For example, the core sample may be obtained at the wellsite system 110. In one or more embodiments, the measured core sample data 235 is measured by at least injecting fluid into the core sample according to a laboratory test procedure. For example, the measured core sample data 235 may include fluid pressures, boundary or confining pressures, differential pressures, temperatures, flow rates of various fluid phases, fluid compositions, fluid rheology, fluid phase conditions and behavior, mobile solid composition and concentration, interfacial tensions, surface tensions and their distribution within the sample for each particular fluid phase, wettability, and changes in any of these properties or conditions during the laboratory test. The measured core sample data 235 may also be associated with details of the equipment used to perform the laboratory test.

In one or more embodiments, the DCA tool 230 includes the DCA simulator 224 that is configured to obtain the digital rock model 236 of the core sample and a fluid model of the fluid being injected into the core sample during the laboratory test. For example, the fluid model description may be an equation of state model or may be based on the Helmholtz free energy model which can be constructed directly from the phase behavior data or from correlated phase behavior data or from the equation of state model. The DCA simulator 224 may use the Density Functional (DF) method for complex pore-scale hydrodynamics. As noted above, the digital rock model describes a physical pore structure in the core sample. Further, the fluid model describes physical properties of the fluid. Accordingly, the DCA simulator 224 is used to perform DCA of the core sample based on the digital rock model 236 and the fluid model to generate the DCA simulation result 238. In one or more embodiments, the laboratory test procedure is analyzed to define various parameters of the DCA simulation (e.g., DCA simulation parameters). The DCA is performed by using the DCA simulator 224 to simulate injecting the fluid into the core sample. Specifically, injecting the fluid into the core sample is simulated using the DCA simulator 224 based on the digital rock model 236, the fluid model, and the parameters defined by the laboratory test procedure. Accordingly, the DCA simulation result 238 models applying the laboratory test procedure to the core sample.

In one or more embodiments, the DCA tool 230 includes the DCA tuning module 223 that is configured to tune the DCA using the measured core sample data 235 to reduce a difference between the DCA simulation result 238 and the measured core sample data 235. In one or more embodiments, tuning the DCA includes adjusting a parameter of the DCA in response to the difference exceeding a pre-determined limit. Accordingly, the adjusted parameter is used by the DCA simulator 224 in another iteration of the DCA simulation to reduce the difference between the DCA simulation result 238 and the measured core sample data 235. In one or more embodiments, the adjusted parameter of the DCA may include a digital core parameter of the digital rock model 236, a fluid parameter of the fluid model, and/or a parameter of the DCA simulation parameters 237. The iteration of the DCA simulation continues until the difference between the DCA simulation result 238 and the measured core sample data 235 becomes less than the pre-determined limit to complete the DCA tuning As noted above, the digital rock model 236 may be a micromodel covering a substantially smaller size of the rock compared to the entire rock sample. In one or more embodiments, the DCA simulator 224 performs each iteration of the DCA simulation using multiple digital rock model instantiations to represent contiguous portions of the core sample. An example of using multiple digital rock model instantiations to represent contiguous portions of the core sample for performing the DCA simulation is described in reference to FIG. 3 below.

Once the DCA tuning is completed, the DCA simulator 224 may be used to perform the simulation of the field 100 based on the adjusted digital core parameter and the adjusted fluid parameter. In one or more embodiments, the simulation of the field 100 may include simulation of the entire field 100 or modeling engineering parameters used for field operations of the field 100. For example, the simulation may include multiphase flow simulation, fluid analysis, reservoir simulation, etc. of the geological structures (106-1 through 106-4) and/or the reservoir 106-5 depicted in FIG. 1. In particular, the multiphase flow simulation may include two-phase (e.g., oil-water, gas-water, gas-oil) or three-phase (e.g., oil-water-gas) immiscible, near-miscible, and/or immiscible flow simulations. In addition, the fluid analysis may include surface phase and thin film dynamics at multiphase flow, chemical enhanced oil recovery (EOR), low salinity flow analysis, etc. As noted above, a field operation may then be performed based on the simulation result. For example, the simulation results may be used to predict downhole conditions, and make decisions concerning oilfield operations. Such decisions may involve well planning, well targeting, well completions, operating levels, production rates and other operations and/or conditions. Often this information is used to determine when to drill new wells, re-complete existing wells, or alter wellbore production.

One or more embodiments of the RP computer system 208 and examples of the preliminary and final results generated thereby are described below.

Digital Core Analysis Work Plan

The digital core analysis of the present disclosure extends the information obtained from laboratory core analysis tests. The first stage is to obtain digital rock models and analyze the pore and grain space to extend the information obtained in thin-section and SEM analysis into the third dimension. The second stage provides a rapid calculation of relative permeability and capillary pressure for each sample. The third stage evaluates the effect of wetting condition on recovery of one sample that is close in properties to the laboratory composite core. The fourth stage is to validate one of the laboratory core floods using a simulator. This core flood involves a water flood followed by a gas flood.

Work Plan Detail

Stage 1: Obtain Rock Model and Evaluate Microstructure

This procedure characterizes the rock samples and obtains and characterizes the rock models.
1. Obtain dual energy computed tomography (CT) scan at 0.5 mm nominal resolution of all core plug samples prior to any other work.
2. Perform heterogeneous rock analysis (HRA, such as TerraTek HRA™ available from Schlumberger Technology Corporation of Salt Lake City, Utah, USA) on all plugs scanned.
3. Use HRA evaluation to select samples for core flood tests and for digital rock analysis to represent each rock type.
4. Cut micro-CT plugs (8 mm by 8 mm cylinders) of samples from each of the most important rock types.
5. Obtain micro-CT scans.
6. Build digital rock models.
7. Determine routine porosity and permeability.
8. Determine digital porosity and axial permeability.
9. Evaluate microstructure of rock models.
    This provides histograms of grain and pore size distributions, preferred orientation, grain and pore sphericity, and pore connectivity.
10. Compare microstructural evaluation (pore/grain size distribution) with thin-section and SEM analysis to add a third dimension to the evaluation.
11. Determine representative elementary volume or area (REV/REA) for determined microstructural parameters.
12. Report.

Stage 2: Perform Rapid Engineering Evaluation

This procedure illustrates the variation of relative permeability and capillary pressure properties for three representative samples from each of three rock types.
1. Define digital fluid properties for brine, oil, and gas based on reservoir properties as used in the laboratory flow tests and strongly water-wet conditions.

2. Perform primary oil-water unsteady state relative permeability (USSo-w relK) to define initial water saturation (Swi) condition.
3. Perform water-oil unsteady state relative permeability (USSw-o relK) from Swi condition.
4. Perform gas-oil unsteady state relative permeability (USSg-o relK) from Swi condition.
5. Perform geometric capillary pressure calculation.
6. Report.

Stage 3: Perform Wettability Sensitivity Study

This procedure examines the effect of wetting as the formation wettability varies from strongly water wet to weakly water wet to weakly oil wet.
1. Use digital fluid properties from Stage 2.
2. Select a rock model that is closest to the properties of the composite core used for the first laboratory flooding test.
3. Use Swi condition from Stage 2.
4. Use representative boundary conditions (reservoir temperature and pressure) and a flow rate of R-lab.
5. Obtain result for strongly wetting system from Stage 2 USSw-o test.
6. From initial condition, simulate unsteady state relative permeability, water displacing oil (USSw-o relK) from Swi for weakly water-wet condition.
7. From initial condition, simulate unsteady state relative permeability, water displacing oil (USSw-o relK) from Swi for weakly oil-wet condition.
8. Compare the three wetting conditions recovery.
9. Report.

Stage 4: Match Digital Simulation to Unsteady State (USS) Laboratory Tests

This procedure performs a history match between the digital and physical laboratory results.

Water Flood Followed by Gas Flood USS Procedure
1. Select digital rock model that is closest to the composite core properties from the laboratory test.
2. Obtain boundary conditions for test from laboratory (temperature, pressure, imposed injection rates or pressure drops, fluid properties) and results from test (production rate, resultant injection rates or pressure drops as a function of time).
3. Use digital fluid properties for brine, oil, and gas based on fluid properties in Stage 2.
4. Establish initial condition of oil and brine saturation representative of reservoir rock.
5. Simulate water flood to flood out using laboratory condition: USSw-o from Swi.
6. Compare endpoint saturation, endpoint permeability, and production history with laboratory test.
   a. Tuning can be performed by altering wettability and interfacial tension within reasonable bounds.
   b. If the digital endpoint oil saturation is significantly lower than the laboratory value, use an earlier point in time in the simulation to match the saturation.
   c. If the digital endpoint oil saturation is significantly higher than the laboratory value, perform a digital bump permeability flow to decrease the saturation.
   d. This saturation point is used for the second stage of the flood, using the distribution of saturation of oil and brine from the end of this water flood test.
7. Simulate gas flood to floodout using laboratory conditions, starting from water flood endpoint saturation: USSg-w/o.
8. Compare endpoint saturation, endpoint permeability, and production history with laboratory test.
   a. Tuning can be performed by altering wettability and interfacial tension within reasonable bounds and subject to previous match.
   b. If the digital endpoint water saturation is significantly lower than the laboratory value, use an earlier point in time in the simulation to match the saturation.
   c. If the digital endpoint water saturation is significantly higher than the laboratory value, perform a digital bump permeability flow to decrease the saturation.
9. Note additional oil production from gas flood.
10. Report.

As shown in FIG. 2, the data repository 234 is configured to store the measured core sample data 235, the digital rock model 236, the DCA simulation parameters 237, and the DCA simulation result 238. The data repository 234 may be a data store such as a database, a file system, one or more data structures (e.g., arrays, link lists, tables, hierarchical data structures, etc.) configured in a memory, an extensible markup language (XML) file, any other suitable medium for storing data, or any suitable combination thereof. The data repository 234 may be a device internal to the RP computer system 208. Alternatively, the data repository 234 may be an external storage device operatively connected to the RP computer system 208.

Figure 3:
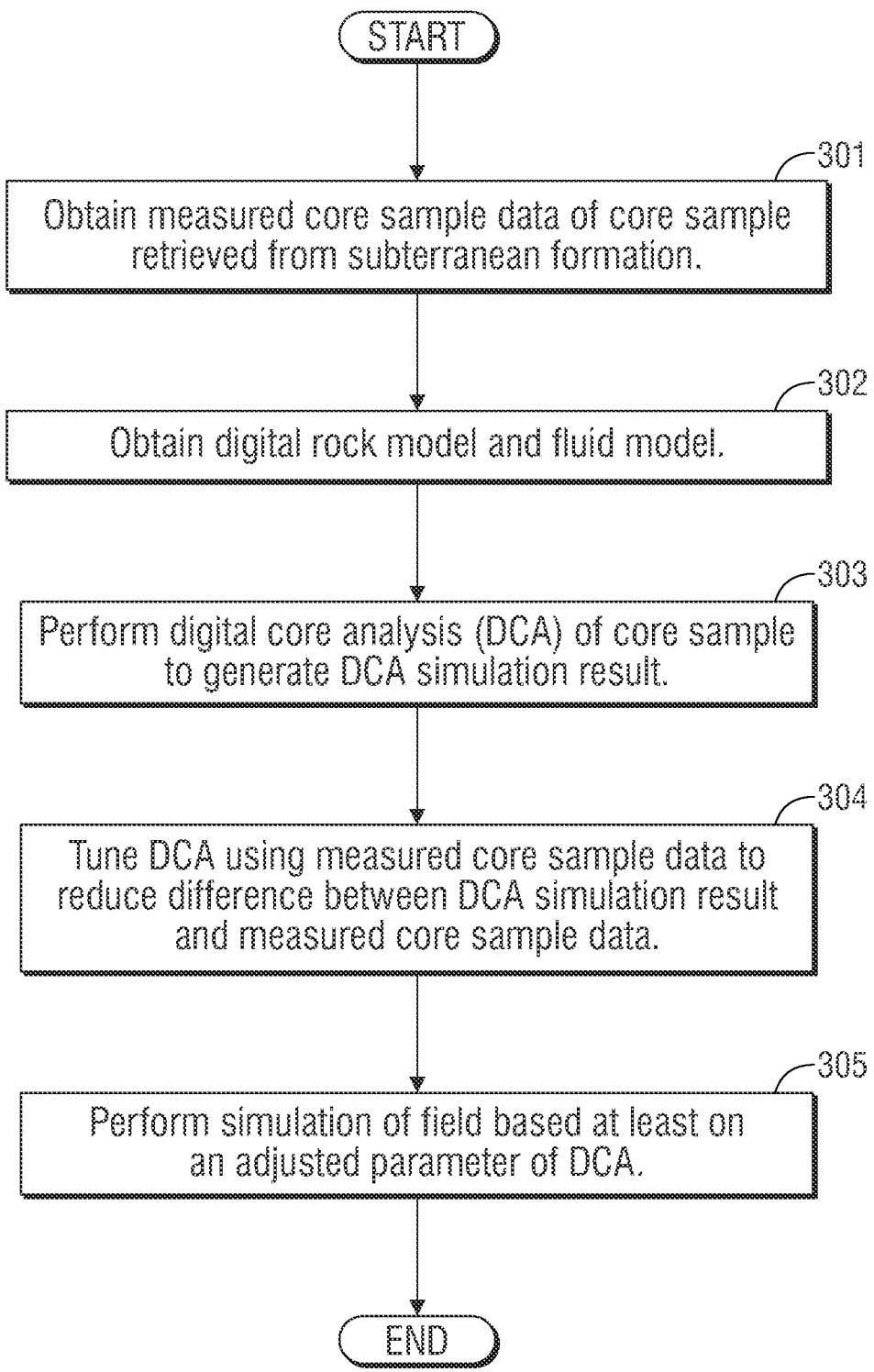
FIG. 3 shows a flowchart of a method in accordance with one or more embodiments.

FIG. 3 depicts an example method for tuning digital core analysis to laboratory results in accordance with one or more embodiments. Specifically, the example method performs digital core analysis simulation of the laboratory evaluation where simulation parameters (referred to as digital conditions) are defined to match the laboratory conditions as appropriate. Note that the digital conditions may not exactly match the laboratory conditions when the scales of the physical core sample and the digital core model are not identical.

In one or more embodiments, the method depicted in FIG. 3 may be practiced using the RP computer system 208 described in reference to FIGS. 1 and 2. In one or more embodiments, one or more of the elements shown in FIG. 3 may be omitted, repeated, and/or performed in a different order. Accordingly, embodiments of horizontal well log curve grids workflow should not be considered limited to the specific arrangements of elements shown in FIG. 3.

Initially in block 301, core sample data of a core sample retrieved from the subterranean formation are measured. In one or more embodiments, the measured core sample data is measured by at least injecting fluid into the core sample according to a laboratory test procedure. For example, the measured core sample data may represent properties of the subterranean fluids.

In block 302, a digital rock model of the core sample and a fluid model of the fluid are obtained. In particular, the digital rock model describes at least a physical pore structure in the core sample, and the fluid model describes at least a physical property of the fluid.

In block 303, digital core analysis (DCA) of the core sample is performed to generate a DCA simulation result. The DCA is performed by simulating injecting the fluid into the core sample based on the digital rock model, the fluid model, and simulation parameters defined by the laboratory test procedure to match the laboratory conditions. Accordingly, the DCA simulation result models applying the laboratory test procedure to the core sample.

In block 304, DCA tuning is performed using the measured core sample data to reduce a difference between the DCA simulation result and the measured core sample data.

In one or more embodiments, tuning the DCA includes adjusting a parameter of the DCA in response to the difference exceeding a pre-determined limit. Accordingly, the adjusted parameter is used in another iteration of the DCA simulation to reduce the difference between the DCA simulation and the measured core sample data. In one or more embodiments, the adjusted parameter of the DCA may include a digital core parameter of the digital rock model, a fluid parameter of the fluid model, and/or a DCA simulation parameter. The iteration of the DCA simulation continues until the difference between the DCA simulation result and the measured core sample data becomes less than the pre-determined limit to complete the DCA tuning In block 305, simulation of the field is performed based at least one the adjusted parameter of the DCA. In one or more embodiments, the simulation is performed further based on the hydrodynamic equations found in Alexander Demianov et al., "Density Functional Modelling in Multiphase Compositional Hydrodynamics", 89 Canadian Journal of Chemical Engineering, 206, 211-12 (April 2011), D. Koroteev, et al., "Application of Digital Rock Technology for Chemical EOR Screening", SPE-165258, 2013.

Figure 4:
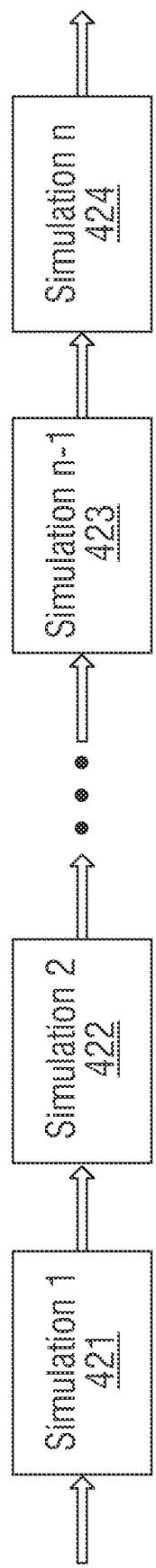
FIG. 4 shows an example diagram in accordance with one or more embodiments.

FIG. 4 shows an example diagram in accordance with one or more embodiments. The example diagram is for explanatory purposes only and not intended to limit the scope of the claims. As shown in FIG. 4, the example diagram illustrates a workflow that allows modeling of core sample fluid injection that has a time or distance scale larger than the range covered by a digital rock model. In this example workflow, multiple simulations (e.g., simulation 1 421, simulation 2 422, simulation n–1 423, simulation n 424, etc. are performed sequentially based on respective instantiations of the digital rock model. In one example scenario, each simulation has an identical starting point of the digital rock model instantiation and fluid saturation locations within the digital rock model instantiation. A fluid is injected into the first digital rock model instantiation and the flow is simulated for a period of time. The time evolutions of the saturation distributions in the first digital rock model instantiation and of the effluent are recorded. This may be done for a specified time or number of simulation time steps, or until the effluent or the digital rock model or both reach equilibrium. The effluent from simulation 1 421 is used, either directly or after some manipulation, as input to the second digital rock model instantiation for simulation 2 422. The flow process is simulated in this second digital rock model instantiation and the time evolutions of the saturation distributions and the effluent are recorded as in during the simulation 1 421. The effluent of the simulation 2 422 is then used as input for the subsequent simulation, and so on through as many simulations (e.g., simulation n–1 423, simulation n 424) as are necessary to model the core sample fluid injection through the time or distance scale. The core sample fluid injection may be evaluated through both the evolution of the effluent and the variations in final states of each simulation.

In another example scenario of this workflow, each simulation uses a different starting digital rock model instantiation, which may differ either in the fluid distributions within the digital rock model instantiation or in the digital rock model instantiation itself, or both. The workflow may proceed as described above.

In either of the two example scenarios of the workflow, additional manipulations of the effluent from one simulation may be done before using it as input into the next simulation. This may involve, for example, extrapolation of fluid property changes beyond that observed in an individual simulation by use of an equation of state model for the fluid.

Figure 5:
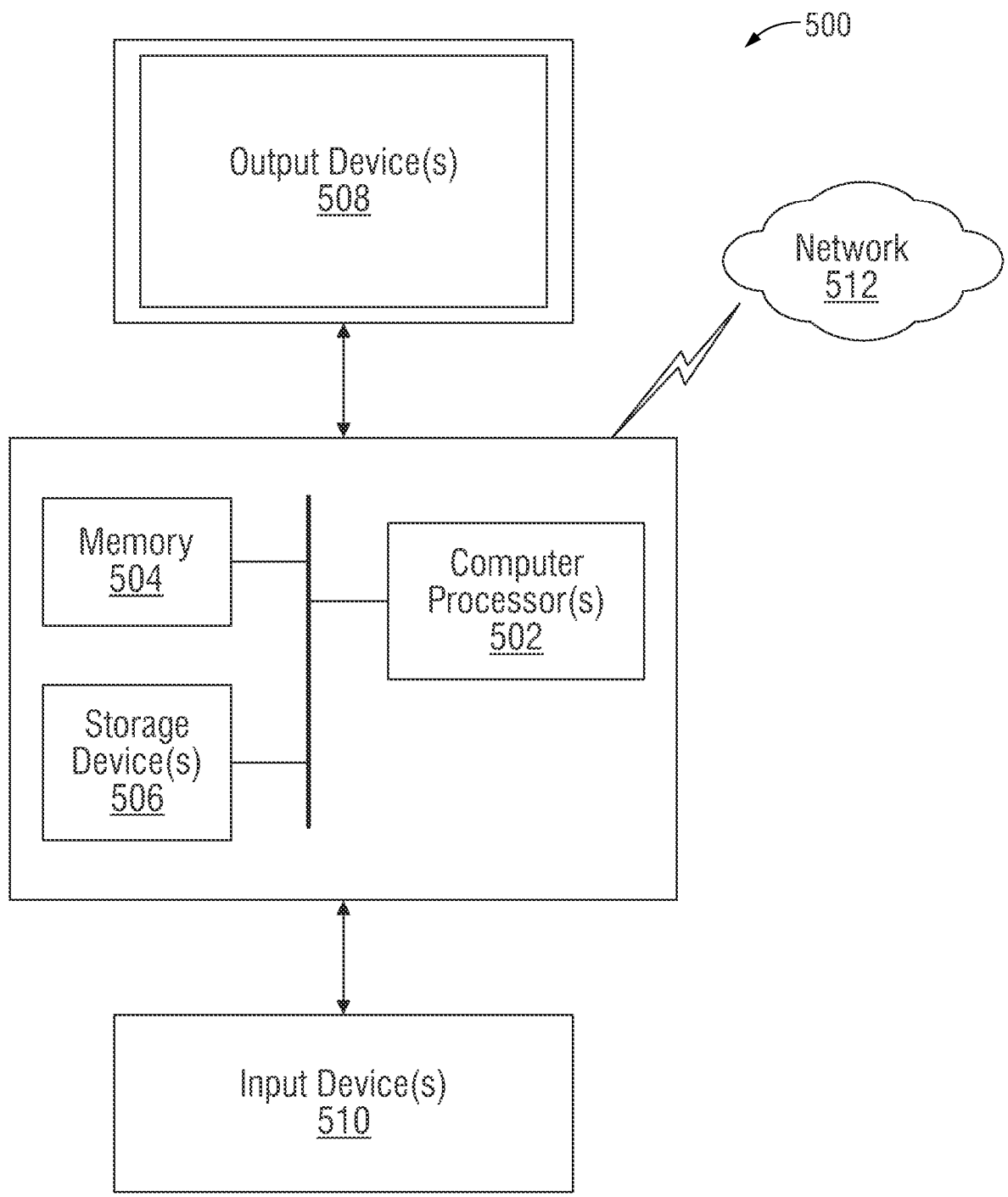
FIG. 5 shows a computing system in accordance with one or more embodiments.

Embodiments of tuning digital core analysis to laboratory results may be implemented on virtually any type of computer regardless of the platform being used. For example, the computing system may be one or more mobile devices (e.g., laptop computer, smart phone, personal digital assistant, tablet computer, or other mobile device), desktop computers, servers, blades in a server chassis, or any other type of computing device or devices that includes at least the minimum processing power, memory, and input and output device(s) to perform one or more embodiments of tuning digital core analysis to laboratory results. For example, as shown in FIG. 5, the computing system 500 may include one or more computer processor(s) 502, associated memory 504 (e.g., random access memory (RAM), cache memory, flash memory, etc.), one or more storage device(s) 506 (e.g., a hard disk, an optical drive such as a compact disk (CD) drive or digital versatile disk (DVD) drive, a flash memory stick, etc.), and numerous other elements and functionalities. The computer processor(s) 502 may be an integrated circuit for processing instructions. For example, the computer processor(s) 502 may be one or more cores, or micro-cores of a processor. The computing system 500 may also include one or more input device(s) 510, such as a touchscreen, keyboard, mouse, microphone, touchpad, electronic pen, or any other type of input device. Further, the computing system 500 may include one or more output device(s) 508, such as a screen (e.g., a liquid crystal display (LCD), a plasma display, touchscreen, cathode ray tube (CRT) monitor, projector, or other display device), a printer, external storage, or any other output device. One or more of the output device(s) 508 may be the same or different from the input device 510. The computing system 500 may be connected to a network 512 (e.g., a local area network (LAN), a wide area network (WAN) such as the Internet, mobile network, or any other type of network) via a network interface connection. The input and output device(s) may be locally or remotely (e.g., via the network 512) connected to the computer processor(s) 502, memory 504, and storage device(s) 506. Many different types of computing systems exist, and the aforementioned input and output device(s) may take other forms.

Software instructions in the form of computer readable program code to perform embodiments of tuning digital core analysis to laboratory results may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that when executed by computer processor(s), is configured to perform embodiments of the present workflow.

Further, one or more elements of the aforementioned computing system 500 may be located at a remote location and connected to the other elements over a network 512. Further, embodiments of tuning digital core analysis to laboratory results may be implemented on a distributed system having a plurality of nodes, where each portion of the workflow may be located on a different node within the distributed system. In one embodiment of tuning digital core analysis to laboratory results, the node corresponds to a distinct computing device. The node may correspond to a computer processor with associated physical memory. The node may correspond to a computer processor or micro-core of a computer processor with shared memory and/or resources.

The systems and methods provided relate to the acquisition of hydrocarbons from an oilfield. It will be appreciated that the same systems and methods may be used for performing subsurface operations, such as mining, water retrieval, and acquisition of other underground fluids or other geomaterials from other fields. Further, portions of the systems and methods may be implemented as software, hardware, firmware, or combinations thereof.

While tuning digital core analysis to laboratory results has been described with respect to a limited number of embodiments, those skilled in the art, having benefit of this disclosure, will appreciate that other embodiments can be devised which do not depart from the scope of tuning digital core analysis to laboratory results as disclosed herein. Accordingly, the scope of tuning digital core analysis to laboratory results should be limited only by the attached claims.

What is claimed is:

1. A method for characterizing a subterranean formation of the earth by performing simulation of a field having the subterranean formation to recover hydrocarbons, comprising:
    obtaining measured core sample data of a core sample retrieved from the subterranean formation, wherein the measured core sample data is measured while at least injecting fluid into the core sample according to a laboratory test procedure;
    obtaining a digital rock model of the core sample and a fluid model of the fluid, wherein the digital rock model describes a physical pore structure in the core sample, and wherein the fluid model describes a physical property of the fluid;
    performing, by a processor of a computer system, digital core analysis (DCA) of the core sample to generate a DCA simulation result, comprising:
        simulating, based on the digital rock model, the fluid model, and at least one parameter defined by the laboratory test procedure, injecting the fluid into the core sample to generate the DCA simulation result, comprising:
            representing a plurality of portions of the core sample by a plurality of digital rock model instantiations;
            simulating a first portion of the plurality of portions to generate a first effluent output, wherein the first portion is simulated based at least on a first injection input and a first digital rock model instantiation of the plurality of digital rock model instantiations; and
            simulating a second portion of the plurality of portions to generate a second effluent output, wherein the second portion is simulated based on the first effluent output and a second digital rock model instantiation of the plurality of digital rock model instantiations,
            wherein the DCA simulation result is based at least on the first effluent output and the second effluent output, and wherein the first effluent output is adjusted before using it in simulating the second portion;
        wherein the DCA simulation result models applying the laboratory test procedure to the core sample;
    tuning, by the processor, the DCA using the measured core sample data to reduce a difference between the DCA simulation result and the measured core sample data, comprising:
        adjusting, in response to the difference exceeding a pre-determined limit, a parameter of the DCA to generate an adjusted parameter; and
        further performing the DCA based on the adjusted parameter to reduce the difference;
    and
    adjusting or performing a field operation according to results of the DCA.

2. The method of claim 1, wherein the parameter of the DCA comprises at least one selected from a group consisting of a digital core parameter of the digital rock model, a fluid parameter of the fluid model, and the at least one parameter defined by the laboratory test procedure.

3. The method of claim 2, wherein the fluid model comprises an equation of state model of the fluid.

4. The method of claim 2,
    wherein the fluid model comprises a fluid model description based on the Helmholtz free energy model constructed from at least one selected from a group consisting of phase behavior data, correlated phase behavior data, and an equation of state model, and
    wherein performing the DCA is based on a Density Functional (DF) method for complex pore-scale hydrodynamics.

5. A computer system for characterizing a subterranean formation of the earthy by performing simulation of a field having the subterranean formation to recover hydrocarbons, comprising:
    a processor and memory; and
    software instructions stored in the memory, executing on the processor, and comprising:
        an input module configured to obtain measured core sample data of a core sample retrieved from the subterranean formation, wherein the measured core sample data is measured while at least injecting fluid into the core sample according to a laboratory test procedure;
        a digital core analysis (DCA) simulator configured to:
            obtain a digital rock model of the core sample and a fluid model of the fluid, wherein the digital rock model describes a physical pore structure in the core sample, and wherein the fluid model describes a physical property of the fluid;
            perform DCA of the core sample to generate a DCA simulation result, wherein the DCA comprises:
                simulating, based on the digital rock model, the fluid model, and at least one parameter defined by the laboratory test procedure, injecting the fluid into the core sample to generate the DCA simulation result, comprising:
                    representing a plurality of portions of the core sample by a plurality of digital rock model instantiations;
                    simulating a first portion of the plurality of portions to generate a first effluent output, wherein the first portion is simulated based at least on a first injection input and a first digital rock model instantiation of the plurality of digital rock model instantiations; and
                    simulating a second portion of the plurality of portions to generate a second effluent output, wherein the second portion is simulated based on the first effluent output and a second digital rock model instantiation of the plurality of digital rock model instantiations, wherein the DCA simulation result is based at least on the first effluent output and the second effluent output, and wherein the first effluent output is adjusted before using it in simulating the second portion;

wherein the DCA simulation result models applying the laboratory test procedure to the core sample;

a DCA tuning module configured to tune the DCA using the measured core sample data to reduce a difference between the DCA simulation result and the measured core sample data, wherein tuning the DCA comprises:

adjusting, in response to the difference exceeding a pre-determined limit, a parameter of the DCA to generate an adjusted parameter, wherein the DCA simulator is further configured to further perform the DCA based on the adjusted parameter to reduce the difference; and a repository configured to store the measured core sample data, the digital rock model, and the DCA simulation result;

wherein the computer system adjusts or performs a field operation based on the DCA simulation result.

6. The computer system of claim 5, wherein the parameter of the DCA comprises at least one selected from a group consisting of a digital core parameter of the digital rock model, a fluid parameter of the fluid model, and the at least one parameter defined by the laboratory test procedure.

7. The computer system of claim 6, wherein the fluid model comprises an equation of state model of the fluid.

8. A non-transitory computer readable medium comprising instructions for characterizing a subterranean formation of the earth by performing simulation of a field having the subterranean formation, the instructions when executed by a computer processor comprising functionality for:

obtaining measured core sample data of a core sample retrieved from the subterranean formation, wherein the measured core sample data is measured while at least injecting fluid into the core sample according to a laboratory test procedure;

obtaining a digital rock model of the core sample and a fluid model of the fluid, wherein the digital rock model describes a physical pore structure in the core sample, and wherein the fluid model describes a physical property of the fluid;

performing digital core analysis (DCA) of the core sample to generate a DCA simulation result, comprising:

simulating, based on the digital rock model, the fluid model, and at least one parameter defined by the laboratory test procedure, injecting the fluid into the core sample to generate the DCA simulation result, comprising representing a plurality of portions of the core sample by a plurality of digital rock model instantiations;

simulating a first portion of the plurality of portions to generate a first effluent output, wherein the first portion is simulated based at least on a first injection input and a first digital rock model instantiation of the plurality of digital rock model instantiations; and simulating a second portion of the plurality of portions to generate a second effluent output, wherein the second portion is simulated based on the first effluent output and a second digital rock model instantiation of the plurality of digital rock model instantiations, wherein the DCA simulation result is based at least on the first effluent output and the second effluent output, and wherein the first effluent output is adjusted before using it in simulating the second portion;

wherein the DCA simulation result models applying the laboratory test procedure to the core sample;

tuning the DCA using the measured core sample data to reduce a difference between the DCA simulation result and the measured core sample data, comprising:

adjusting, in response to the difference exceeding a pre-determined limit, a parameter of the DCA to generate an adjusted parameter; and further performing the DCA based on the adjusted parameter to reduce the difference; and adjusting or performing a field operation according to the DCA simulation result.

9. The non-transitory computer readable medium of claim 8, wherein the parameter of the DCA comprises at least one selected from a group consisting of a digital core parameter of the digital rock model, a fluid parameter of the fluid model, and the at least one parameter defined by the laboratory test procedure.

10. The non-transitory computer readable medium of claim 9, wherein the fluid model comprises an equation of state model of the fluid.

* * * * *